US009140731B2

(12) United States Patent
Francis et al.

(10) Patent No.: US 9,140,731 B2
(45) Date of Patent: Sep. 22, 2015

(54) ALGORITHM AND IMPLEMENTATION SYSTEM FOR MEASURING IMPEDANCE IN THE D-Q DOMAIN

(75) Inventors: Gerald Francis, Silver Spring, MD (US); Rolando Burgos, Blacksburg, VA (US); Dushan Boroyevich, Blacksburg, VA (US); Fred Wang, Knoxville, TN (US); Zhiyu Shen, Blacksburg, VA (US); Paolo Mattavelli, Blacksburg, VA (US); Kamiar Karimi, Kirkland, WA (US); Sheau-Wei Johnny Fu, Bellevue, WA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 351 days.

(21) Appl. No.: 13/618,513

(22) Filed: Sep. 14, 2012

(65) Prior Publication Data

US 2013/0099800 A1    Apr. 25, 2013

Related U.S. Application Data

(60) Provisional application No. 61/535,398, filed on Sep. 16, 2011.

(51) Int. Cl.
*G01R 27/02* (2006.01)
*G01R 27/16* (2006.01)
*H02J 3/38* (2006.01)

(52) U.S. Cl.
CPC .............. *G01R 27/02* (2013.01); *G01R 27/16* (2013.01); *H02J 3/38* (2013.01)

(58) Field of Classification Search
CPC ........ G01R 27/02; G01R 27/08; G01R 27/16; G01R 31/00; G01R 31/08; G01R 27/32; G05F 3/02; H02M 5/4585
USPC ......... 324/521, 522, 527, 600, 602, 650, 707, 324/252, 260, 765.01; 323/317; 702/58, 65; 363/34, 37, 40, 52, 53, 80; 318/400.02, 318/400.21, 400.22
See application file for complete search history.

(56) References Cited

U.S. PATENT DOCUMENTS

| | | | |
|---|---|---|---|
| 4,851,782 A * | 7/1989 | Jeerings et al. | 324/520 |
| 2009/0230980 A1* | 9/2009 | Williams | 324/707 |
| 2012/0063179 A1* | 3/2012 | Gong et al. | 363/40 |
| 2012/0259477 A1* | 10/2012 | Abido et al. | 700/297 |

* cited by examiner

*Primary Examiner* — Arleen M Vazquez
*Assistant Examiner* — Neel Shah
(74) *Attorney, Agent, or Firm* — Whitham Curtis Christofferson & Cook, PC

(57) ABSTRACT

A controller and infrastructure for an impedance analyzer measures responses to perturbations to respective phases of a multi-phase system at an interface between stages thereof (which may be considered as a source and load in regard to each other), such as a multi-phase electrical power system, to determine a transfer function for each phase of the multi-phase system from which the impedance of each of the source and load can be calculated, particularly for assessing the stability of the multi-phase system.

12 Claims, 8 Drawing Sheets

- Inject perturbation current in d-q frame aligned with Vd at point of common coupling 1. Inject id = ip, iq = 0

$$\begin{bmatrix} v_{d1}(s) \\ v_{q1}(s) \end{bmatrix} = \begin{bmatrix} Z_{Ldd}(s) & Z_{Ldq}(s) \\ Z_{Lqd}(s) & Z_{Lqq}(s) \end{bmatrix} \begin{bmatrix} i_{Ld1}(s) \\ i_{Lq1}(s) \end{bmatrix}$$

2. Inject id = 0, iq = ip $$\begin{bmatrix} v_{d2}(s) \\ v_{q2}(s) \end{bmatrix} = \begin{bmatrix} Z_{Ldd}(s) & Z_{Ldq}(s) \\ Z_{Lqd}(s) & Z_{Lqq}(s) \end{bmatrix} \begin{bmatrix} i_{Ld2}(s) \\ i_{Lq2}(s) \end{bmatrix}$$

- From these measurements the impedance matrix can be solved $$\begin{bmatrix} Z_{Ldd}(s) & Z_{Ldq}(s) \\ Z_{Lqd}(s) & Z_{Lqq}(s) \end{bmatrix} = \begin{bmatrix} i_{Ld1}(s) & i_{Lq1}(s) \\ i_{Ld2}(s) & i_{Lq2}(s) \end{bmatrix}^{-1} \begin{bmatrix} v_{d1}(s) & v_{q1}(s) \\ v_{d2}(s) & v_{q2}(s) \end{bmatrix}$$

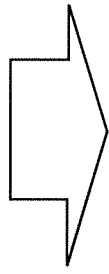

$$\begin{bmatrix} Z_{Ldd}(s) \\ Z_{Lqd}(s) \end{bmatrix} = \begin{bmatrix} i_{Ld1}(s) & i_{Lq1}(s) \\ i_{Ld2}(s) & i_{Lq2}(s) \end{bmatrix}^{-1} \begin{bmatrix} v_{d1}(s) \\ v_{q2}(s) \end{bmatrix}$$

$$\begin{bmatrix} Z_{Ldq}(s) \\ Z_{Lqq}(s) \end{bmatrix} = \begin{bmatrix} i_{Ld1}(s) & i_{Lq1}(s) \\ i_{Ld2}(s) & i_{Lq2}(s) \end{bmatrix}^{-1} \begin{bmatrix} v_{d1}(s) \\ v_{q2}(s) \end{bmatrix}$$

*Figure 10*

ALGORITHM AND IMPLEMENTATION SYSTEM FOR MEASURING IMPEDANCE IN THE D-Q DOMAIN

CROSS-REFERENCE TO RELATED APPLICATIONS

This application claims benefit of priority of U.S. Provisional Application 61/535,398, filed Sep. 16, 2011, of which is hereby incorporated by reference in their entireties. This application is also related to U.S. patent application Ser. No. 13/608,218, filed Sep. 10, 2012, which is also incorporated by reference in its entirety.

FIELD OF THE INVENTION

The present invention generally relates to a methodology and apparatus for direct measurement of impedance of an AC power source and power converter and, more particularly, to measurement of impedance of portions of a power circuit at interfaces therebetween and which may be time-varying and/or non-linear; which measurements may be conducted on-line while the power circuit is delivering power to a load.

BACKGROUND OF THE INVENTION

Traditionally, electrical power has been produced by large, geographically separated facilities and transmitted as high-voltage alternating current to other locations. These large power generation facilities are connected through a network, sometimes referred to as a power grid such that power produced by locations having excess power generation capacity can be diverted to areas where loads may be particularly large at any given time. In the proximity of loads, the voltage is generally reduced in stages and further distributed until the location of various loads is reached. The high voltage used for transmission over long distances allows currents and resistive losses to be reduced while using cables of reduced conductor material content. Use of alternating current allows the reduction of voltage by the use of transformers. Alternating current can also be directly used by many common and familiar loads such as household appliances, pumps using electric motors and the like.

However, many familiar loads are principally based on electronic circuits which are rapidly increasing in number and power requirements and the proportion of the load of many other devices that is presented by electronics (e.g. processor controlled appliances) is also increasing rapidly. Many new devices such as electrically powered vehicles are also being introduced. Most of these types of loads require direct current (DC) power. Additionally, environmental concerns have encouraged the development of local power generation and/or storage systems in many locations to serve local "islands" or groups of customers where power distribution can be provided as either AC or DC current. Power storage must generally be provided with DC power. Therefore, the need for conversion between AC and DC power is proliferating rapidly at the present time and is likely to accelerate.

Power converters are, by their nature, non-linear and their dynamic behaviors are coupled with those of the load from which they receive power or the source providing power through them. As a consequence, many power electronics systems will require control in order to provide a regulated output. However, provision of such regulation causes additional phenomena that have not been previously observed or considered to be of importance, including but not limited to issues of stability.

Specifically, a power converter under regulated output control exhibits negative incremental impedance characteristics at its input. That is, in the case of converters regulating voltage (to a different form of that of the source), the current consumed by them is inversely proportional to voltage variations of the source in order to maintain a constant power flow to the load. This is the inverse behavior of resistive loads, whose current consumption is directly proportional to voltage variations of the source. Consequently, the small-signal response at a given operating point, corresponding to the linearization of the converter at such point, presents negative phase. As is well recognized in the art, negative impedance can result in instabilities and possibly oscillatory behavior of the circuit with detrimental effects to the system where they operate.

While the extensive power grid can tolerate many of these behaviors since the effect of converter behavior is small compared to the size of the system, such behaviors cannot be tolerated by smaller systems which have their own, relatively small capacity power source and are not connected to the effectively infinite power grid. Examples of such smaller systems are aircraft, water-borne vessels, hybrid electric vehicles and small power plants (e.g. wind turbines or solar collector farms) serving individuals or small "islands" of customers. Other examples of circumstances where unstable behavior may occur are instances where electrical loads are connected through equipment such as frequency changers (AC/AC converters), AC/DC converters and other types of hardware. Vehicular systems also operate at higher line frequencies than the line frequencies traditionally used for power distribution and present other phenomena and challenges in regard to control.

Systems which can potentially exhibit unstable behaviors are becoming prevalent due to proliferation of systems such as are discussed above and, further, by shifting functions previously performed mechanically or hydraulically to electrically powered functions. Accordingly, it is imperative that potential instabilities be made predictable and avoided in the design of such systems. Therefore, stability of electrical systems has been a subject of substantial interest and study in recent years; yielding some solutions for DC systems such as DC/DC converters. However, there are issues not seen in DC systems which are present in AC systems and multi-phase AC/DC systems, in particular, which are referred to as multi-variable systems. While some progress has been made in regard to determining stability or forbidden operating conditions of multi-phase AC/DC systems, the analysis has been extremely complex and burdensome and has, in general, led to excessively conservative designs and operating parameters.

Many authors have also suggested algorithms to extract parameters from the system to fit a predetermined system model. While this approach is not black-box impedance measurement, as it is based on a known model or mathematical description of the system, it is noteworthy as it is another technique used to acquire actual data to fit a model of the system. It is, however, not as accurate as individual point measurements.

Additional work has been done on the capture of dynamics via artificial recurrent neural networks in the d-q coordinate system. These methods inject noise into the system and learn and record the response of the system dynamics to the noise. The system input-output relationship can then be learned from the response. This approach has an advantage in that if the network is trained properly it can filter out exogenous noise from the measurements. Although this approach does capture the dynamics of the system, it does not address extraction of the impedance from the dynamic results, and focuses mostly on the network itself. It should be noted that all three of these techniques are only simulated. There is no discussion of the error of the approximation.

SUMMARY OF THE INVENTION

It is therefore an object of the present invention to provide a an apparatus for measuring impedance of respective phases of a multi-phase AC supply, power converter stage(s) and/or load at an interface therebetween for purposes of evaluating stability of the combination thereof.

In order to accomplish these and other objects of the invention, an apparatus for measuring impedances of respective phases of a multi-phase electrical power system at any system interface between stages of the multi-phase electrical power system is provided comprising a phase locked loop for aligning a frame of reference with an input power vector and a plurality of angles, a sweep generator for applying perturbations to respective phase of the interface over a range of frequency, in sequence, to the multi-phase electrical power system, voltage and current sensors for measuring amplitude and phase of the voltage and current responses to respective perturbations, and a computer to compute impedances of respective phases of the interface from phase and amplitude of voltage and current responses to the perturbations over the range of frequency of respective perturbations.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
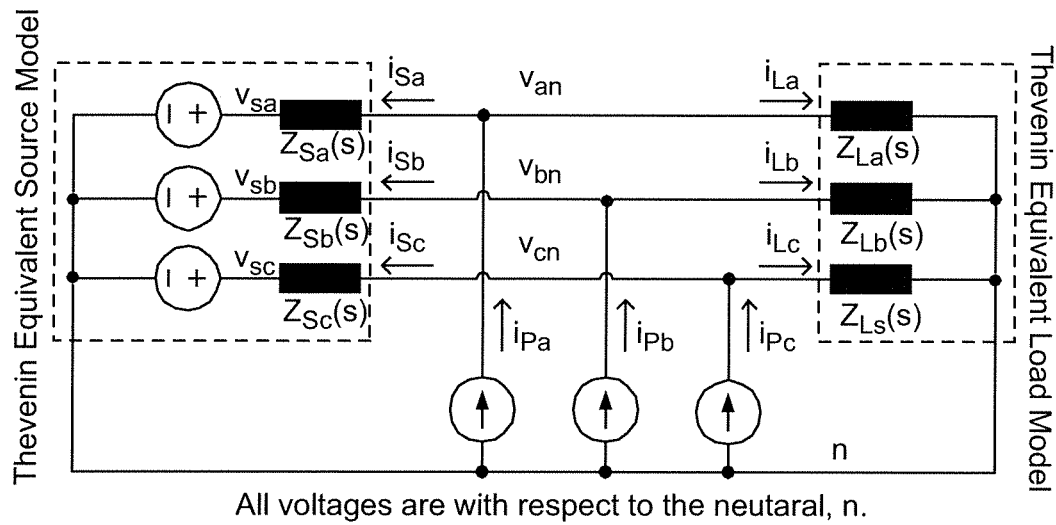
FIG. 1 is a schematic illustration of on-line measurement of impedance at an exemplary interface of a three-phase power converter system.

Referring now to the drawings, and more particularly to FIG. 1, there is shown a schematic diagram of a generalized there-phase power system having an interface between a source and a load. It should be understood that any juncture between portions of a power converter system will provide an interface between "upstream" circuits and "downstream" circuits and that the former functions as a source for the latter and the latter may be considered as a load for the former. In the schematic diagram of FIG. 1, current sources $i_{Pa}$, $i_{Pb}$ and $i_{Pc}$ are capable of injecting current into and thus perturbing the respective phases of the power converter circuit. The source and load impedances (e.g. $Z_{sa}(s)$ and $Z_{la}(s)$ for phase a) of respective phases can thus be derived from the resulting voltages and upstream and downstream currents (e.g. voltage $v_{an}$, $v_{sa}$ and $v_{La}$ and currents $i_{sa}$ and $i_{La}$ for phase A).

The above-incorporated U.S. patent application Ser. No. 13/608,213 discloses a simplified methodology for studying power circuit stability in which the multi-variable problem is reduced in several ways to be amenable to relatively much more simple analysis. Specifically, in that application, it was demonstrated that stability of a power circuit is determined by the scalar return-ratio across the d-q frame active power transfer channel which is the d-d channel for a $V_q=0$ alignment of the d-q frame. The multi variable stability problem of multi-phase AC power sources or loads is reduced to the scalar case and can be analyzed by the single input, single output (SISO) standard Nyquist stability theorem, as distinct from requiring use of the generalized Nyquist stability theorem or the multi-variable Nyquist stability theorem which are far more complex and burdensome and lead to excessively conservative evaluations as applied to power converters. Further, it was demonstrated that there is no need to know all the system dynamics but only the impedance characteristics at each interface of the power converter. Such impedance characteristics can be determined through circuit analysis but, preferably, can be more conveniently derived through direct measurement. However, since it is a requirement for valid stability analysis that such a measurement be conducted on-line while rated power is being delivered to a load, significant requirements are imposed on the required instrumentation which the invention fully answers.

The power system thus interfaces devices used to control power flow in order to provide power to the load, such as three-phase power converters. Analysis of these devices and systems can be performed at multiple levels, ranging from power flow and power quality all the way to models of the solid state semiconductor devices in the converters themselves. Appropriate models are chosen based on the level of analysis to be performed. Since this invention focuses on measuring impedance as a function of frequency, the models will be small signal models representing the converter and subsystem(s) behavior at a given operating point.

Although these systems have been simplified by such models, they remain challenging to analyze, often providing multiple stability points (and therefore regions of attraction, and a series of other nonlinear phenomena, ranging from bifurcation to limit cycles and chaos. Furthermore, such nonlinear systems operate on a nominal trajectory in steady-state operation, nominally given by $$v_a(t) = V_m\cos(\omega t)$$
$$v_b(t) = V_m\cos\left(\omega t - \frac{2\pi}{3}\right)$$
$$v_c(t) = V_m\cos\left(\omega t + \frac{2\pi}{3}\right)$$

(1)

making them non-stationary systems with periodic tendencies.

To simplify analysis, attempts have been made and have given rise to convention, to map this non-stationary system and its components to one which is stationary, mitigating (but unfortunately, in practice, not completely eliminating) the non-autonomous nature of such systems. A rotating coordinate system can be defined that matches the frequency of rotation of the voltage vector, making the voltage appear stationary in that frame of reference (referred to hereinafter simply as "frame"). This transformation is shown by $$\begin{bmatrix} v_d(t) \\ v_q(t) \\ v_0(t) \end{bmatrix} = \sqrt{\frac{2}{3}} \begin{bmatrix} \cos(\omega t) & \cos\left(\omega t - \frac{2\pi}{3}\right) & \cos\left(\omega t + \frac{2\pi}{3}\right) \\ -\sin(\omega t) & -\sin\left(\omega t - \frac{2\pi}{3}\right) & -\sin\left(\omega t + \frac{2\pi}{3}\right) \\ \frac{1}{\sqrt{2}} & \frac{1}{\sqrt{2}} & \frac{1}{\sqrt{2}} \end{bmatrix} \begin{bmatrix} v_a(t) \\ v_b(t) \\ v_c(t) \end{bmatrix} \quad (2)$$

For the systems of interest, the third component, known as the 0-axis, can be ignored. In effect, if the system is balanced, this axis is effectively zero. For linear analysis of nonlinear systems, it is necessary to have an operating point upon which to perform linearization. When the system is unbalanced, this operating point disappears when using the map described above, and the system cannot be linearized. Thus classical stability analysis becomes difficult without further tools. If the three voltages follow the trajectory specified in equation (1) then the resulting vector in the d-q frame, calculated by applying (2) will be $$\begin{bmatrix} v_d(t) \\ v_q(t) \\ v_0(t) \end{bmatrix} = \sqrt{\frac{2}{3}} \begin{bmatrix} \frac{3}{2} \\ 0 \\ 0 \end{bmatrix} V_m \quad (3)$$

Systems of loads and sources, although stable individually, may become unstable when they are interconnected. Stability in the d-q frame has been explored previously for systems whose impedance is known. Based on the analysis of these methods, it is possible to predict whether or not the interconnection of two power electronics subsystems operating at an operating point will produce a stable system. In order to apply these methods in practice, it becomes necessary to be able to measure the impedance to which to apply the criteria respectively proposed therein.

Figure 2:
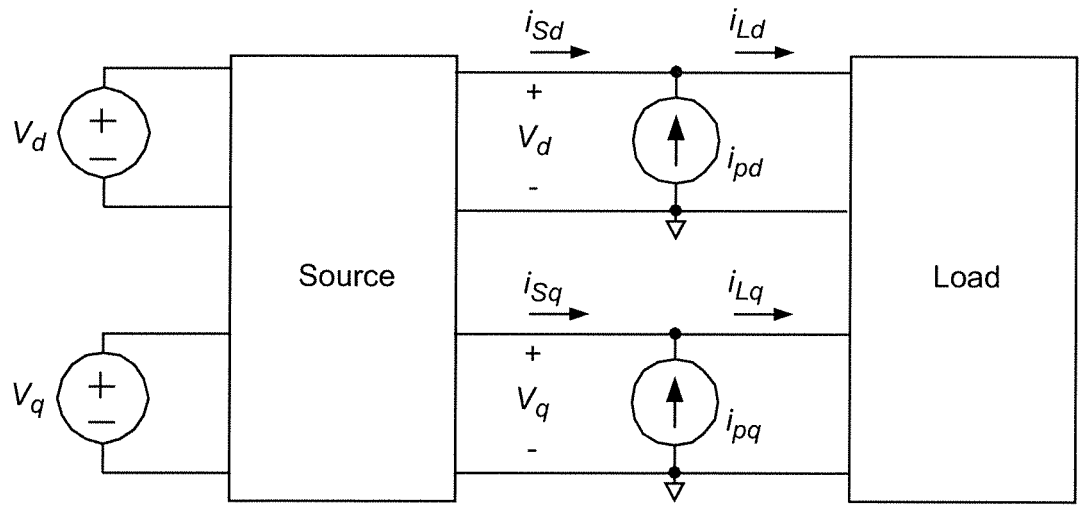
FIG. 2 is a schematic illustration of an equivalent circuit of FIG. 1 represented in the d-q domain.

Given a three-phase A-B-C system (simplified in FIG. 1 to a wye-configuration for ease of understanding), a shunt current source is placed at the point of measurement as shown in FIG. 1. This system, when transformed to the D-q domain may be represented as shown in FIG. 2. A single port balanced time-invariant network represented in the D-q domain may be described by the following transfer function matrix:

$$\begin{bmatrix} v_{d1}(s) \\ v_{q1}(s) \end{bmatrix} = \begin{bmatrix} Z_{Ldd}(s) & Z_{Ldq}(s) \\ Z_{Lqd}(s) & Z_{Lqq}(s) \end{bmatrix} \begin{bmatrix} i_{Ld1}(s) \\ i_{Lq1}(s) \end{bmatrix} \quad (4)$$

Due to the stationary nature of the system, it can be assumed that the transfer function between different inputs and outputs can be measured sequentially or simultaneously without any change in the results, and that measurements can be repeated as many times as necessary, retrieving the same transfer function each time. If only one side (e.g. load or source) of the system was being measured, current could simply be injected into the D-axis and the corresponding voltage components measured while keeping the Q-axis zero. As the injection must be in a shunt configuration to achieve an on-line measurement, however, this is not the case.

The perturbation is a vector and, due to the shunt configuration, that vector will split when the perturbation reaches the point of common coupling. It is assumed, however, that when a current injection is made to perturb at a different angle, that the load and source current and voltage vector perturbation will rotate by that same angular difference.

There are several challenges to overcome to accomplish such a measurement. Nearly all systems are nonlinear, and as such, require an operating point in order to take a measurement. This requires the system to be operating during the measurement. As most of these converters are designed for a high power level, it precludes the use of most commercially available equipment used to measure impedance via traditional means. Such equipment can take highly accurate measurements but only at very low power levels. For linear, time-invariant, balanced networks, an operating point is not required, but for nonlinear systems, unless the impedance can be transformed a posteriori, it is necessary for the system to be at the system operating point. This is a requirement for nearly all systems that involve power electronics equipment.

Such a restriction gives rise to several challenges in implementing a measurement system for such a measurement subsystem. The first is the ability to induce a perturbation into a system. Such an injection must be supplied at a reasonable magnitude (e.g. 1-2% of system rated power) in order to perturb the system, and the injection equipment must be able to operate with other power sources active in the systems which are significantly larger than the injection. Furthermore, unlike traditional analyzers, the analyzer in accordance with the invention must measure the impedance in an artificial frame of reference that does not physically exist. There are no d- and q-axis terminals to which one may connect a sensor, and such a reference frame must be derived via real time processing.

The nonlinear nature of these systems requires them to be running when measured, and therefore most attempts to inject a perturbation including those reported in DC/DC converter literature, have provided methods for such. Without the challenge of a rotating coordinate system, logic or impedance analyzers can be directly connected to amplifiers or coupling networks which couple the perturbation to the system. This is shown in FIG. 1 where the perturbation is injected by the shunt current sources as illustrated. This Figure should be understood to illustrate a generic three-phase system where the source supplies a load, where both the source and load are represented by an equivalent Thevinin circuit representation. The input impedance and impedance of the converter may be measured in this case by measuring the current and voltage response to the perturbation current.

Figure 3:
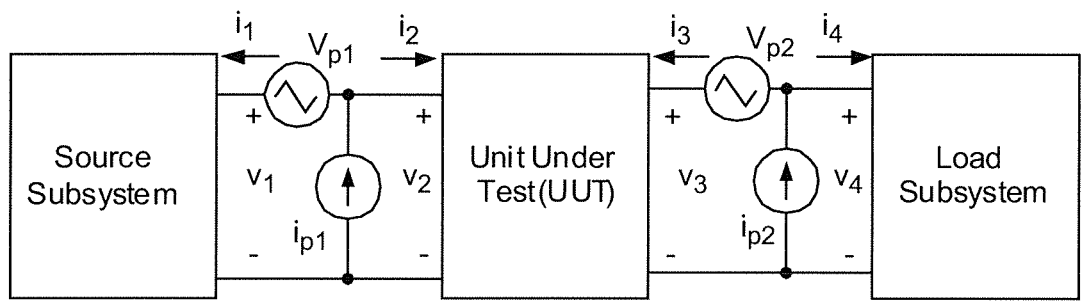
FIG. 3 is a schematic depiction of a DC power conversion system under perturbation.

Referring now to FIG. 3, to create a perturbation at an interface, a series voltage source or current source may be used or a series or shunt configured impedance may be used. These devices modify the system currents and voltages in order to create a perturbation. It should be noted that the location where the system is perturbed is not necessarily the same location where the resulting perturbation is measured. That is, $i_{p2}$ may be used to create a perturbation while $i_1$ and $v_1$ are being measured. The sources shown in FIG. 3 are not in the system, but are placed there for the purpose of measuring impedances within the system via injection hardware.

When measuring impedance or admittance, a small signal phenomenon, an input (current or voltage) and an output (voltage or current) must be measured. For a linear system (or a nonlinear system that is linearized about an operating point), the input and output signal components, both at the same frequency, are related by a transfer function which defines the gain and phase shift at that frequency.

It has been reported that a power converter was used to generate a perturbation into the system on all three phases. A voltage source inverter was attached to the system, and was provided power on the DC side from an external source. The converter was shunt connected to the power system. Activating the converter switches allowed the converter to inject current into the system. It has been theoretically shown that this technique may be performed using an active filter but such a technique has not been demonstrated. The results were simulated.

A wound-rotor induction machine can be used to inject a perturbation into the system. DC current is injected into the machine and the machine is allowed to synchronize with the system, after which the perturbation can be injected on top of the DC signal. The machine injects onto all three phases as it rotates.

A third technique modulates a three-phase shunt-connected resistive impedance (done with a three-phase chopper circuit). This injection is made smoother with the addition of a series inductor. A power semiconductor switch shorted one resistor to create the modulation. A similar method to inject a perturbation was also created that modulated an impedance only between two of the three phases.

Another injection method that has been proposed is series voltage injection. However, this is less practical due to the large currents present in the system.

The converter-based perturbation methods above have been directly connected to the system. If isolation is desired or the electronics used are insufficient to inject a signal of proper magnitude due to the limitations of the electronics involved, the use of a transformer may be warranted. Using a transformer, however, imposes additional restrictions on the injected frequency content, as will be discussed.

While injection itself is a challenge, a second challenge involves the presence of exogenous signals in the network during measurement. Since the network is nonlinear, it is measured during its operation. As such, there are other exogenous signals present due to the system's operation. These include, but are not limited to, line frequency harmonics, switching ripple, low frequency modulation effects, zero crossing distortions due to non-ideal behavior of diodes and diode rectifier bridges in the system, load-source interactions, and others. While attempts have been made to mitigate these effects, they still prevail in many systems.

In the d-q frame, an alignment is chosen which defines the frame. In general, either the d-axis or the q-Axis is aligned to the rotating voltage vector. If the d-q frame is aligned to a different angle, the measured impedance may also change. A property of showing no change when changing the alignment angle of the d-q frame to the rotating voltage vector is referred to as isotropism or rotational invariance. If the impedance of a system is dependent on the alignment of the d-q frame the impedance is called anisotropic. It is therefore necessary for anisotropic systems that the d-q coordinate system is aligned properly with the variable of interest. In accordance with the invention, it is preferred, but not required, that the d-q frame will be aligned with the d-axis such that the q-axis voltage component is centered on zero for simplicity. Such an alignment will be assumed in the following discussion.

This alignment is usually achieved via a phase locked loop (PLL) that controls the reference frame angular velocity until it aligns with the rotating voltage vector. However, if the voltage vector has harmonics or noise, or if there are imbalances in the system created by the system itself or by the injected perturbation, the PLL will have a reaction to it, and the frame will no longer be rotating at exactly a constant frequency. Instead of a PLL, a low pass filter on the line voltage has been attempted but will be even more significantly affected by these harmonics and other exogenous signals as the basis voltage will contain low frequency perturbation signals. To date, no discussion of the PLL is presented in researched literature for the purpose of impedance measurement. Nonetheless, several PLL designs have been found to be robust to the presence of system imbalance.

As there are two channels, d and q, the impedances are expressed as matrices, and there exists coupling between the load and source subsystems represented by these matrices. A perturbation on the d-channel can cross-couple to the q-channel output, which can then interact with the load, and again cross-couple to produce a voltage response back on the d-channel. This interaction makes the impedance appear to include the load, and is a result of having a multi-variable system. The solution must decouple this interaction.

An additional challenge that arises when building a measurement system is the ability to verify that the measurements are correct. In the case of linear networks it is possible to derive the expected d-q impedances given symmetric, linear, time-invariant impedances of each phase in stationary coordinates. It should be noted that no published result seen that did conduct experimental work verified the full impedance they were measuring against known impedances by measuring them using dedicated equipment. The closest to this was a low order parametric model constructed using nominal parameters of a load inductance and resistance.

For other systems, such as voltage source inverters, an approximate model is well-known representing the system dynamics under ideal conditions. However, this approximate model is derived from ideal switching behavior, and is not without assumptions. For verification purposes, it is important to know that the model is accurate and represents the true behavior of the converter despite the presence of other time-varying and nonlinear behavior such as converter dead-time and the potential discontinuous conduction of each phase around the zero crossing.

The need to know the system impedance has been made apparent based on system stability requirements, which have recently become important based on the ever-increasing demands of equipment with destabilizing effects on their host systems. These motivations are increased by the increasing number of small systems with limited power generation capability and the increased transition of former hydraulic and mechanical systems to electrical power, as alluded to above.

Previous attempts to measure three-phase impedances have been incomplete. Results presented by these previous attempts do not provide confidence that the measurements are being performed in an approach acceptable for all load types, especially ones containing power converters. Reasons for this lack of confidence include a series of issues related to d-q frame alignment, nonlinear load behavior, multi-channel power flow, and a range of exogenous signals preventing successful and complete measurement.

Furthermore, no published work attempts to characterize their measurement system for accuracy. As the objective is to formulate a measurement instrument, it is essential to know its limitations, operational boundaries and capabilities to avoid accepting incorrect measurements. Additional work is required in order to understand these characteristics and capabilities.

In order to address these problems, certain features of these problems must be individually addressed. First is the D-q frame. If measurements are to be taken in the D-q frame, it is necessary that a stable reference frame is established prior to measurement at the desired angle with respect to the system voltage or current and that does not vary during any measurements taken.

Any phase locked loop may work for the application given that it can have a variable bandwidth which can be changed during runtime. However, due to small imbalances, a three-phase PLL is selected that decouples the positive and negative sequences of the voltage with which it is synchronizing. Keeping in mind the algorithm will be implemented in software, a version of the referenced PLL, once tailored to the specific voltage sequences, can be simplified. Once the reference frame is defined via the PLL, it is possible to analyze the system dynamics in this frame by introducing perturbations into the system.

Given a current perturbation, $i_p(s)$, into the system, the perturbation will enter and split, some going to the load and some going to the source as illustrated in FIG. 1. For compactness of notation, the following are defined:

$$v(s) = v_S(s) = v_L(s) = \begin{bmatrix} v_d(s) \\ v_q(s) \end{bmatrix} \tag{5}$$

$$i_S(s) = \begin{bmatrix} i_{Sd}(s) \\ i_{Sq}(s) \end{bmatrix} \tag{6}$$

$$i_P(s) = \begin{bmatrix} i_{Pd}(s) \\ i_{Pq}(s) \end{bmatrix}$$

$$i_L(s) = \begin{bmatrix} i_{Ld}(s) \\ i_{Lq}(s) \end{bmatrix}$$

Accordingly, the impedances can be defined as:

$$Z_L(s) = \begin{bmatrix} Z_{Ldd}(s) & Z_{Ldq}(s) \\ Z_{Lqd}(s) & Z_{Lqq}(s) \end{bmatrix} \tag{7}$$

$$Z_S(s) = \begin{bmatrix} Z_{Sdd}(s) & Z_{Sdq}(s) \\ Z_{Sqd}(s) & Z_{Sqq}(s) \end{bmatrix}$$

From FIG. 2, it follows that $$i_s(s) + i_p(s) = i_L(s) - Z_s(s)^{-1}v(s) + i_p(s) = Z_L(s)^{-1}v(s) \tag{8}$$

Giving:

$$[Z_L(s)^{-1} + Z_S(s)^{-1}]^{-1} i_P(s) = v(s) \tag{9}$$

Thus, if estimates of the values of $Z_s$ and $Z_L$ are available, an estimate can be made as to how much perturbation must be injected in order to achieve a desired voltage perturbation to be measurable beyond the quantization non-linearities introduced by the load, source, and measurement system.

Similarly, it can be shown that the current will split between the load and source as shown below:

$$v(s) = v_s(s) = v_L(s) \tag{10}$$

$$[Z_L(s)^{-1} + Z_S(s)^{-1}]^{-1} i_P(s) = -Z_S(s) i_S(s) = Z_L(s) i_L(s) \tag{11}$$

From equations (10) and (11), the current to each side can be directly calculated as:

$$Z_S(s)^{-1}[Z_L(s)^{-1} + Z_S(s)^{-1}]^{-1} i_P(s) = i_S(s)$$

$$Z_L(s)^{-1}[Z_L(s)^{-1} + Z_S(s)^{-1}]^{-1} i_P(s) = i_L(s) \tag{12^2}$$

In this regard, it is also helpful to recognize that $$i_S(s) = -Z_S(s)^{-1} Z_L(s) i_L(s) \tag{13}$$

Thus, whenever one impedance is much greater than the other impedance, it will be difficult to measure the current response related to that side, as most of the current will flow in the opposite direction, leading to measurement range restrictions as applied to the current sensors and the associated A/D converters, which must measure the large signal response while being able to accurately measure the small signal response. Based on the estimated value of the impedances, this can be used to calculate the necessary perturbation current or voltage value in order to cause a disturbance in the system of sufficient magnitude.

Many commercially available instruments are available to measure the transfer function between an input and an output, and as such, it is preferred to utilize such equipment in the practice of the invention. Gain and phase analyzers have the ability to reject components of the signal which are not closely related to its own perturbation. Regardless of the technique or instrument used, the purpose of this block (also shown in FIG. 4) is to measure the gain from a single input to a single output.

As only one input-output relationship can be measured at a time and the complete system is represented by a multi-input, multi-output transfer function (the impedance), it will be necessary to make multiple sweeps to fully characterize the impedances of multi-phase systems, where a sweep refers to the continuous excitation of the system with perturbations of, for example, increasing frequency value. Furthermore, as there is a coupling between the load and source subsystems, one injection cannot easily be set to be identically zero. As can be observed in equation (10), both the load and source impedances are present in both equations, and they must be decoupled if one is to isolate a load or a source subsystem from others.

Figure 4:
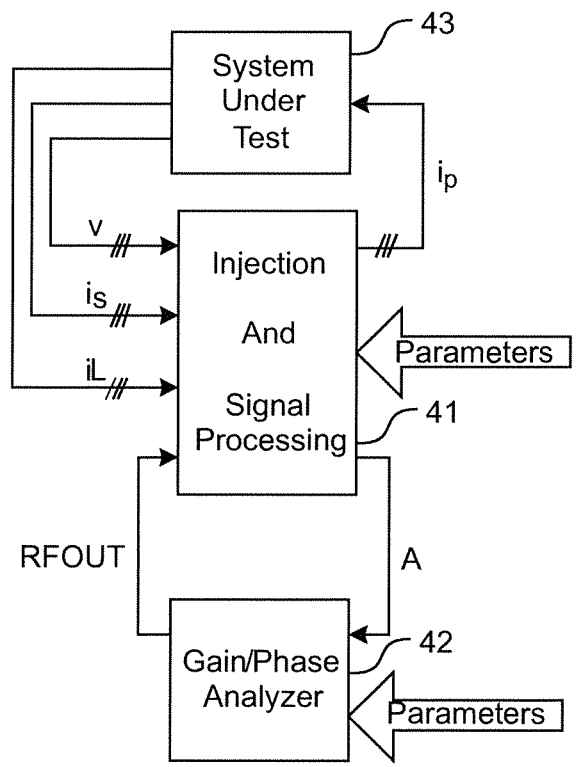
FIG. 4 is a functional block diagram of an analyzer in accordance with the invention.

As schematically shown in FIG. 4, this is accomplished by injecting on $i_{Pd}$ and $i_{Pq}$, and obtaining responses on $i_{Sd}(s)$, $i_{Sq}(s)$, $i_{Ld}(s)$, $i_{Ld}(s)$, $v_d(s)$, and $v_q(s)$ as described earlier. Similarly, rotating the perturbation vector, $i_P$ so that $i_{Pd}$ and $i_{Pq}$ have a new and different proportion, there will be a second set of linearly independent responses on the vectors $i_s$, $i_L$ and v. On each of the measurements, these signals are measured as three-phase variables and converted into the d-q frame in the signal processing element 41 as shown in FIG. 4. The corresponding d-q terms are then sent out to the gain/phase analyzer 42 as signal A, which ultimately measures and calculates the response signals of interest, that is, transfer functions. The gain/phase analyzer 42 similarly generates the perturbation signal$_{Rfout}$ that is converted from the d-q frame into a three-phase variable by the signal processing block 41 prior to its injection into the system under test 43 through amplifiers.

In the following equations, let the subscripts 1 and 2 denote two independent perturbation angles. When measuring the load, injection into $i_{Pd}$ gives $$\begin{bmatrix} v_{d1}(s) \\ v_{q1}(s) \end{bmatrix} = \begin{bmatrix} Z_{Ldd}(s) & Z_{Ldq}(s) \\ Z_{Lqd}(s) & Z_{Lqq}(s) \end{bmatrix} \begin{bmatrix} i_{Ld1}(s) \\ i_{Lq1}(s) \end{bmatrix} \tag{14}$$

Similarly, injecting a second time with a linearly independent injection vector gives a rotated response:

$$\begin{bmatrix} v_{d2}(s) \\ v_{q2}(s) \end{bmatrix} = \begin{bmatrix} Z_{Ldd}(s) & Z_{Ldq}(s) \\ Z_{Lqd}(s) & Z_{Lqq}(s) \end{bmatrix} \begin{bmatrix} i_{Ld2}(s) \\ i_{Lq2}(s) \end{bmatrix} \quad (15)$$

Notice that the impedance has not changed as the system is the same. The response has changed as dictated by the inputs and outputs. The equations containing $v_{d1}$ and $v_{d2}$ can be regrouped as:

$$\begin{bmatrix} v_{d1}(s) \\ v_{d2}(s) \end{bmatrix} = \begin{bmatrix} i_{Ld1}(s) & i_{Lq1}(s) \\ i_{Ld2}(s) & i_{Lq2}(s) \end{bmatrix} \begin{bmatrix} Z_{Ldd}(s) \\ Z_{Ldq}(s) \end{bmatrix} \quad (16)$$

From equation (16), the impedances $Z_{ldd}(s)$ and $Z_{ldq}(s)$ can be respectively computed as:

$$\begin{bmatrix} i_{Ld1}(s) & i_{Lq1}(s) \\ i_{Ld2}(s) & i_{Lq2}(s) \end{bmatrix}^{-1} \begin{bmatrix} v_{d1}(s) \\ v_{d2}(s) \end{bmatrix} = \begin{bmatrix} Z_{Ldd}(s) \\ Z_{Ldq}(s) \end{bmatrix} \quad (17)$$

Similarly, this technique can be reapplied to the q-axis voltages:

$$\begin{bmatrix} i_{Ld1}(s) & i_{Lq1}(s) \\ i_{Ld2}(s) & i_{Lq2}(s) \end{bmatrix}^{-1} \begin{bmatrix} v_{q1}(s) \\ v_{q2}(s) \end{bmatrix} = \begin{bmatrix} Z_{Lqd}(s) \\ Z_{Lqq}(s) \end{bmatrix} \quad (18)$$

Transposing and stacking these equations yields the final form:

$$\begin{bmatrix} i_{Ld1}(s) & i_{Lq1}(s) \\ i_{Ld2}(s) & i_{Lq2}(s) \end{bmatrix}^{-1} \begin{bmatrix} v_{d1}(s) & v_{d2}(s) \\ v_{q1}(s) & v_{q2}(s) \end{bmatrix} = \begin{bmatrix} Z_{Ldd}(s) & Z_{Ldq}(s) \\ Z_{Lqd}(s) & Z_{Lqq}(s) \end{bmatrix} \quad (19)$$

When measuring these responses, if the same filter (if used) is applied to every measurement, then that filter will cancel as it can be factored out of the matrix. Similarly, processing delay introduced in each measurement will be eliminated. Thus, symmetrical linear elements such as anti-aliasing filters present on both the current and voltage measurements will not influence the impedance calculation. It is therefore desirable to make all measurement channels to be as similar as possible to eliminate distortion and maintain valid transfer function measurements.

In the solution, it should be noted that the procedure does not directly measure ratios of voltage to current perturbation responses, but instead measures voltages and currents with respect to a given repeatable reference, which remains the same for all the sweeps. Eight variables are therefore measured (four currents and four voltages) per injection, and those injections occur at two different angles.

As the procedure measures only one transfer function at a time, it is necessary to assume the measurements are repeatable, and that the system has extremely little time variation in the d-q domain. If the system were to be able to move its operating point during the measurement, it would be impossible to sequentially measure the transfer functions, as the state of the system would be different for each measurement. Similarly, the system must be operating at a constant frequency, and that frequency should not change with the introduction of a perturbation.

More than two sets of vectors may be used as well to calculate the measured impedances if multiple frequency sweeps are conducted measuring multiple responses. This requires that the multiple sweeps are performed at the exact set of frequency points so that multiple measurements exist at each of these points. This results in the construction of larger matrices as opposed to the two vectors built as described above. If n linearly independent injection vectors are used the responses can be aggregated into new matrices V(s) and I(s) as follows:

$$V(s) \triangleq \begin{bmatrix} v_{d1}(s) & v_{q1}(s) \\ \vdots & \vdots \\ v_{dn}(s) & v_{qn}(s) \end{bmatrix} \quad (20)$$

$$I_L(s) \triangleq \begin{bmatrix} i_{Ld1}(s) & i_{Lq1}(s) \\ \vdots & \vdots \\ i_{Ldn}(s) & i_{Lqn}(s) \end{bmatrix}$$

Using these matrices as definitions, the impedance can be calculated as:

$$Z_L(s) = [I_L(s)^T I_L(s)]^{-1} I_L(s)^T V(s) \quad (21)$$

This procedure can be repeated for the source impedance, replacing matrix $I_L$ with the corresponding matrix $I_s$. When there are only two samples used, the approaches are identical:

$$[I_L(s)^T I_L(s)]^{-1} I_L(s)^{-1} I_L(s)^{T-1} I_L(s)^T = I_L(s)^{-1}$$

$$Z_L(s) = I_L(s)^T V(s) \quad (22)$$

In order to measure a system's transfer function, it is necessary to observe an input and an output of the system which are related by the transfer function that defines the system. There may be signals present at the point of measurement that are not created or considered by the system under test. It is important not to take these signals into account as part of the calculation of a transfer function. Examples of such signals are noise, sensor characteristics, and line frequency harmonics.

Commercial equipment is available which, if included in the solution, allows for these details to be neglected by the algorithm as mentioned earlier. An example of such equipment is an Agilent 4395A Gain/Phase analyzer.

Figure 5:
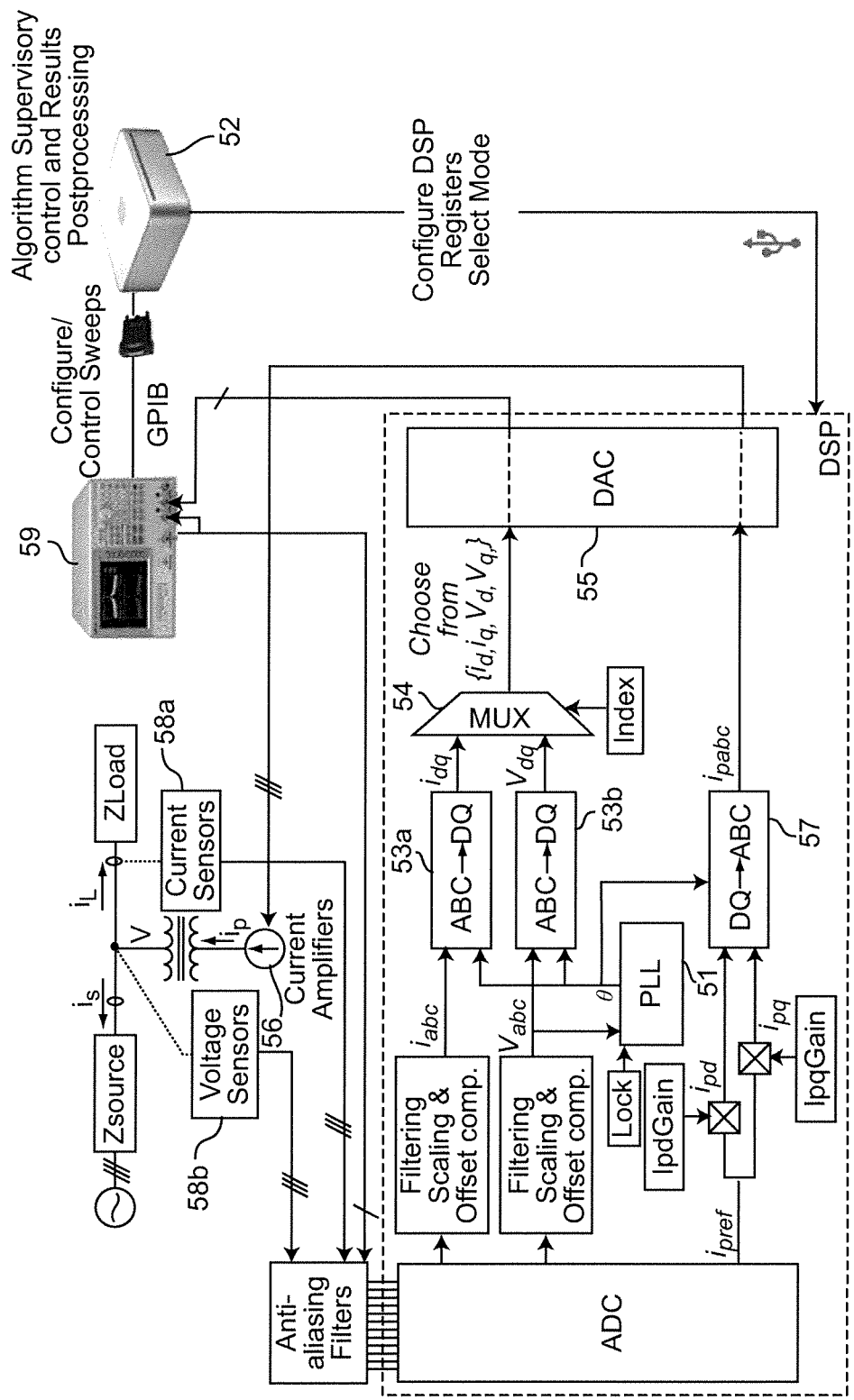
FIG. 5 illustrates a suitable exemplary architecture for performing the analyzer algorithm in accordance with the invention.

A set of software and hardware have been built to implement the impedance measuring methodology presented. A schematic representation of functional elements and their interrelationship of this implementation of the invention is illustrated in FIG. 5 to implement the algorithm and methodology of the invention. As alluded to above, the synchronization of the D-q frame with the input power for conversion of the ABC variables of FIG. 1 to the D-q domain variables shown in FIG. 2 is controlled by phase locked loop 51 while the selection and control of Frequency sweeps is performed by computer 52. The perturbation signal of the logic analyzer 59 is passed through anti-aliasing filters prior to A/D conversion. Once converted into a digital signal, the perturbation signal follows two channels scaled by the d-q frame gains IpdGain and IqGain to form the resultant perturbation vector in the d-q frame. This vector is then converted to ABC variables at 57, and converted with D/A converter 55 into analog signals used as a reference for amplifiers 56 which are preferably coupled to the system under test through transformers. Current and voltage sensors 58a and 58b measure the responses to the perturbation sweeps and return measurements to the system through anti-aliasing filters and A/D converters for compensation of the perturbations in a manner not critical to the practice of the invention as well as gain adjustment. The resultant conversion of the ABC variables to the d-q domain for the two equivalent channels are performed by elements 53a and 53b and multiplexed through multiplexer 54 and converted into analog signals by the D/A converter 55 to provide the response signal to the impedance analyzer 59. This operation closes the signal flow loop.

In the preferred embodiment of the invention hardware comprises a set of three amplifiers used to perform the injections and capable of producing perturbations of substantial power, sensors, transformers used to isolate the system, analog signal processing, and digital logic. The hardware suitable for practice of the invention may be any of a wide variety of forms, the details of which are not at all critical to the practice of the invention other than to provide current and voltage injection and measurement capabilities suitable to the power transfer capacity of the system to be tested. However, the preferred hardware architecture as described above is considered to be important.

Figure 6:
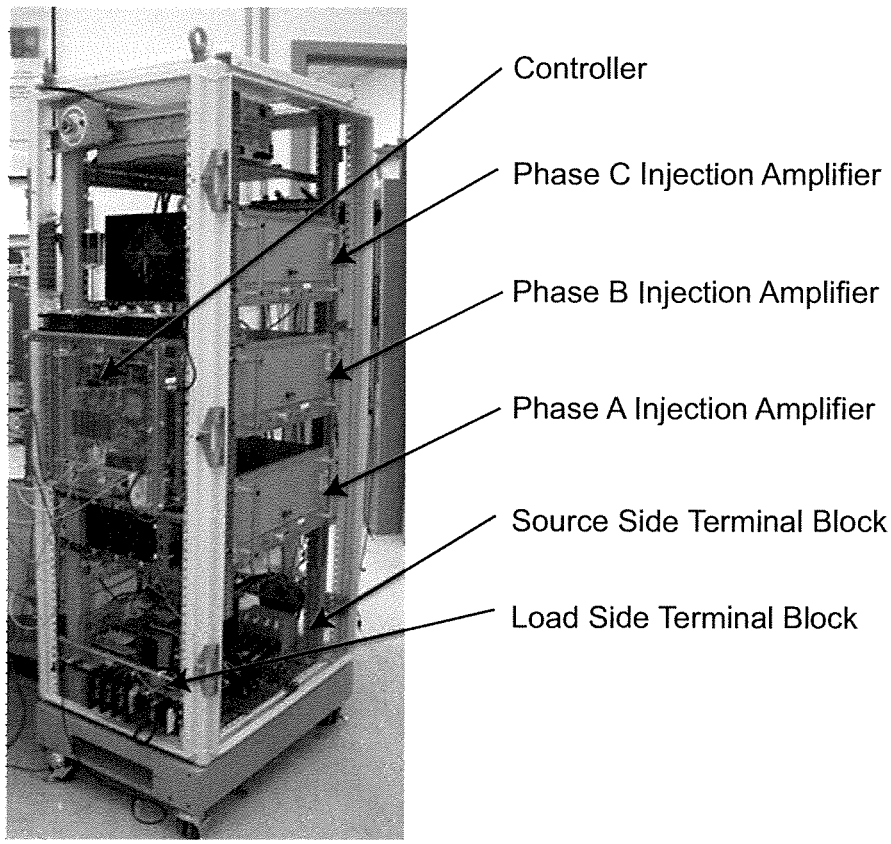
FIG. 6 illustrates a preferred form of a prototype analyzer in accordance with the invention.
Figure 7:
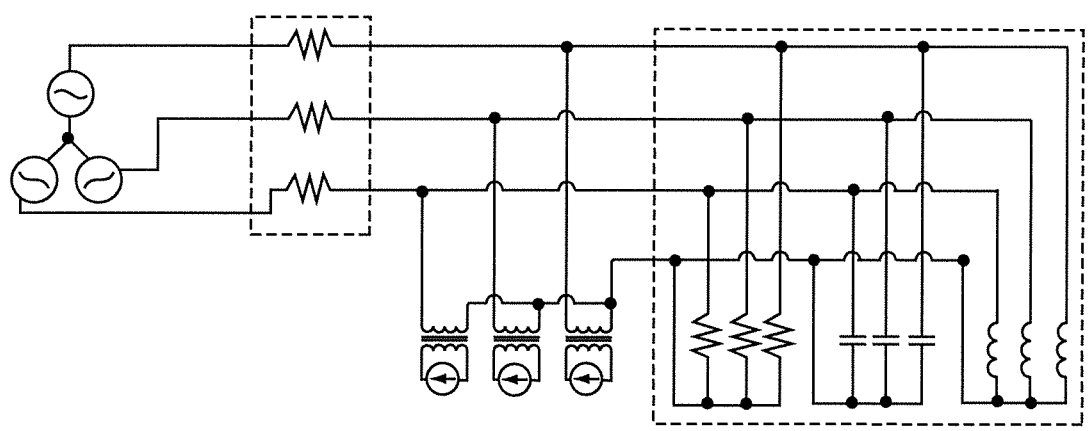
FIG. 7 is a schematic diagram of an exemplary and generalized system under test with the analyzer inserted.
Figure 7A:
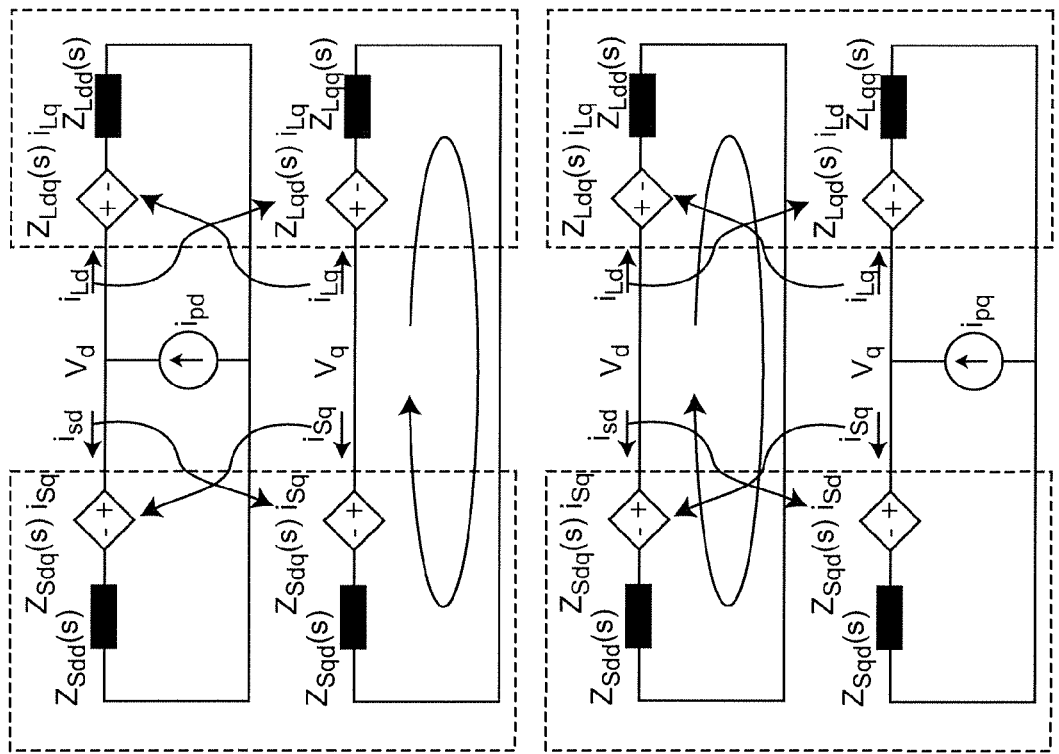
FIG. 7A is a diagram useful for understanding measurement sweeps in accordance with the invention, FIG. 8 graphically illustrates experimentally measured direct-channel impedances of an exemplary test circuit, FIG. 9 graphically illustrates experimentally measured cross-channel impedances of the same exemplary test circuit, and FIG. 10 summarizes the development of impedance and admittance measurements from the measurements made by an embodiment of the invention.

The preferred architecture discussed above follows algorithm and system interface requirements. It consists of injection amplifiers used to inject the perturbation into the system, coupling magnetics, current and voltage sensors for each phase, and a control system which is used to inject the disturbance. A prototype of the system is shown in FIG. 6. The coupling of the system in accordance with the invention to an arbitrary system under test is schematically illustrated in FIG. 7 and sequentially performs the measurement sweeps as illustrated in FIG. 7A to gather the data from which the transfer functions of the phases of the ABC model of FIG. 1 can be determined.

To verify the operation of the algorithm, a passive load was connected on the load side, and a source with resistors was connected on the source side. The schematic of the system is shown in FIG. 7. The system was run up to the maximum current for the given source. The component and operating point parameters are given in Table 1.

TABLE 1

System Under Test Parameters

| Description | Value | Unit |
| --- | --- | --- |
| RMS Line Current | 5 | A |
| Line Frequency | 500 | Hz |
| Load inductance | 216 | mH |
| Load capacitance | 90 | mF |
| Load resistance | 3 | Ω |
| Source resistance | 0.3 | W |

Figure 8:
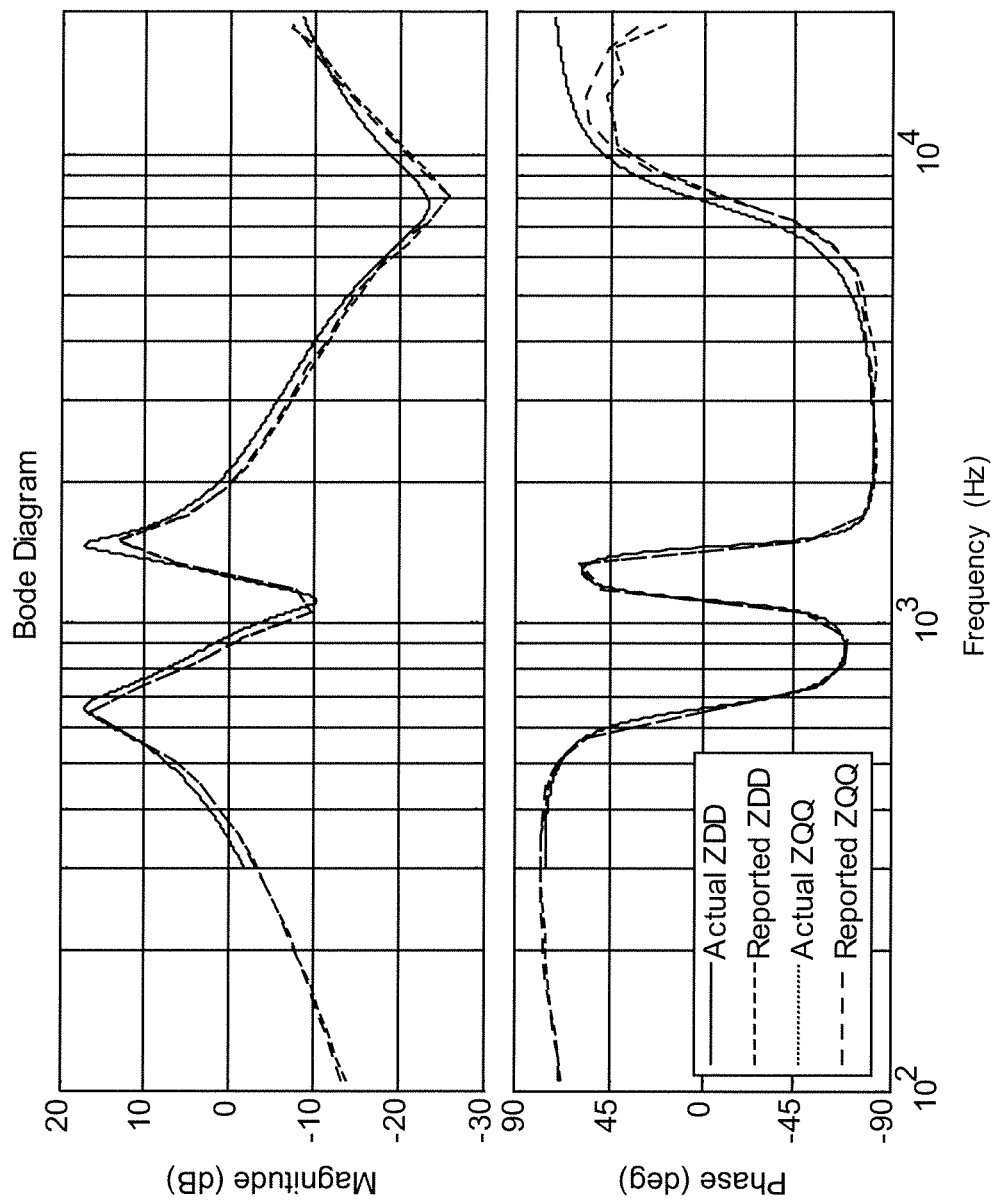
Figure 9:
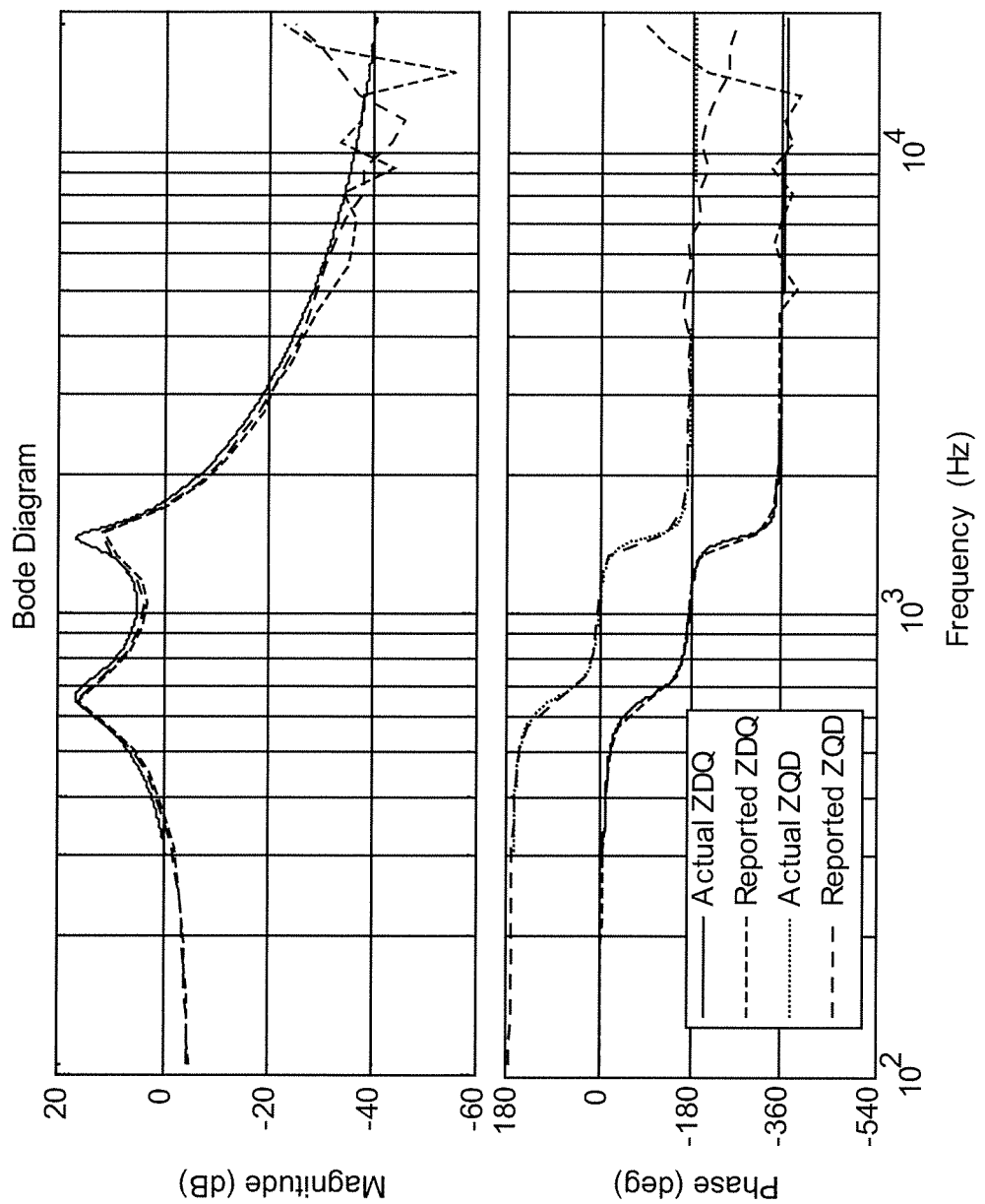

To verify the impedance, the stationary frame impedance was measured via a precision impedance analyzer (HP 4194) and transformed into the D-q domain. The transformed impedance and the corresponding measurement are shown in FIG. 8 and FIG. 9. It is to be noted that the measured data extends past the computed impedances in the D-q domain because the computation method requires information about the stationary frame impedance one line frequency below lowest computed D-q frequency.

In view of the foregoing, it is seen that the invention provides a three-phase impedance analyzer for the purposes of measuring three phase impedances in the d-q frame. A review of existing methods indicates that while components of the total solution exist, one cohesive solution that addresses all critical issues simultaneously does not. The invention uses a conventional impedance analyzer and provides a suitable digital control system infrastructure built around it to enable the measurement of three-phase impedances in AC electrical systems. The invention achieves this function by injecting sequential perturbations on the d-q frame after proper alignment of the frame gas been achieved and measuring the response of the system in terms of the AC interface voltages and source and load currents. These inherently multi-phase variables are converted into the d-q frame and transmitted back to the impedance analyzer in a series of sequential measurements. The measurements are then used to solve the equations shown in FIG. 10, finally yielding the impedance values. The algorithm and methodology described above allows for the measurement of three phase impedances in the D-q frame via injection on multiple axes which are synchronized to the three phase network via a variable bandwidth PLL. The acquisition and analysis segments of the process have been described with supporting experimental results. A hardware architecture has been introduced which supports the algorithm and power level requirements while sustaining compatibility with the system under test.

While the invention has been described in terms of a single preferred embodiment, those skilled in the art will recognize that the invention can be practiced with modification within the spirit and scope of the appended claims.

The invention claimed is:

1. Apparatus for measuring impedances of respective phases of a multi-phase electrical power system at any system interface between stages of said multi-phase electrical power system, said apparatus comprising
    a phase locked loop for aligning a frame of reference with an input power vector and a plurality of angles,
    a sweep generator responsive to said phase locked loop for applying perturbations at said angles to which said frame of reference is aligned to respective phases of said system interface over a range of frequency whereby an angle of said perturbation is controlled, in sequence, to said multi-phase electrical power system, said perturbations being applied through amplifiers,
    voltage and current sensors for measuring amplitude and phase of the voltage and current responses to respective said perturbations, and
    a computer to compute impedances of respective phases of said interface from phase and amplitude of voltage and current responses to said perturbations over said range of frequency of respective said perturbations.

2. The apparatus as recited in claim 1, wherein said perturbations are produced by amplifiers.

3. The apparatus as recited in claim 1 wherein said perturbations have a magnitude in the range of 1% to 2% of the rated power of said multi-phase electrical power system.

4. The apparatus as recited in claim 1, wherein said perturbations are coupled to said multi-phase electrical power system through transformers.

5. The apparatus as recited in claim 1, wherein said perturbations are applied at different angles in the d-q frame.

6. The apparatus as recited in claim 5, wherein said perturbations are aligned with the d-axis and q-axis in the d-q frame.

7. The apparatus as recited in claim 1, wherein said perturbation is converted to a three-phase variable prior to being applied to said multi-phase electrical power system.

8. The apparatus as recited in claim 1 wherein said multi-phase electrical power system is a three-phase electrical power system.

9. The apparatus as recited in claim 1 wherein said measurement of current and voltage includes measurement of both amplitude and phase at each frequency in said range of frequencies of said perturbations provided by said sweep generator as transfer functions from which said impedances are calculated.

10. The apparatus as recited in claim 1, wherein each perturbation is a vector and at least two sets of vectors are applied.

11. The apparatus as recited in claim 1, wherein said voltages and currents are measured with respect to a repeatable reference which remains the same for all sweeps.

12. The apparatus as recited in claim 1, further including a digital controller and an impedance analyzer.

* * * * *